United States Patent [19]

Endoh et al.

[11] Patent Number: 5,485,094
[45] Date of Patent: Jan. 16, 1996

[54] METHOD FOR TESTING PRINTED WIRING BOARDS FOR SHORT CIRCUITS

[75] Inventors: Chihiro Endoh; Toshihiko Tada, both of Kawasaki, Japan

[73] Assignee: Fujitsu Limited, Kawasaki, Japan

[21] Appl. No.: 214,317

[22] Filed: Mar. 17, 1994

[30] Foreign Application Priority Data

Jun. 10, 1993 [JP] Japan .................... 5-138141

[51] Int. Cl.⁶ ............................ G01R 31/28; G06F 11/22
[52] U.S. Cl. ...................... 324/537; 324/527; 324/158.1; 371/27
[58] Field of Search .................... 324/512, 527, 324/537, 540, 73.1, 158 R, 158.1; 371/22.1, 25.1, 27

[56] References Cited

U.S. PATENT DOCUMENTS

| | | | |
|---|---|---|---|
| 3,657,527 | 4/1972 | Kassabgi et al. | 371/25.1 |
| 3,673,397 | 6/1972 | Schaefer | 371/25.1 |
| 4,045,736 | 8/1977 | Carpenter et al. | 371/27 X |
| 4,584,683 | 4/1986 | Shimizu | 371/27 X |
| 4,807,229 | 2/1989 | Tada | 371/27 |
| 5,027,353 | 6/1991 | Jarwala et al. | 371/27 |
| 5,305,329 | 4/1994 | Sasaki | 371/27 |

*Primary Examiner*—Kenneth A. Wieder
*Assistant Examiner*—Diep Do
*Attorney, Agent, or Firm*—Staas & Halsey

[57] ABSTRACT

A test pattern preparation unit divides output pins of each circuit element mounted on a printed wiring board into a group to which a logical value 0 is assignable and a group to which a logical value 1 is assignable, to thereby prepare a test pattern for detecting short-circuit failures between the groups. If short-circuit failures are undetectable among output pins in a given group, these output pins are further divided into a group to which the logical value 0 is assignable and a group to which the logical value 1 is assignable. In this way, the output pins are repeatedly divided into groups, to form test patterns for detecting short-circuit failures. These test patterns are applied to the board through a tester to detect short-circuit failures.

6 Claims, 8 Drawing Sheets

Fig.6A

| OUTPUT PINS | LOGICAL VALUES ASSIGNABLE TO OUTPUT PINS | | |
|---|---|---|---|
| | 1ST PATTERN | 2ND PATTERN | 3RD PATTERN |
| AO | 0 | 0 | 0 |
| BO | 0 | 1 | 1 |
| CO | 0 | 0 | 0 |
| DO | 1 | 1 | 1 |
| EO | 1 | 0 | 0 |
| FO | 1 | 1 | 0 |

Fig.6B

| OUTPUT PINS | LOGICAL VALUES ASSIGNABLE TO OUTPUT PINS | | |
|---|---|---|---|
| | 1ST PATTERN | 2ND PATTERN | 3RD PATTERN |
| AO | 0 | 1 | 1 |
| BO | 0 | 1 | 0 |
| CO | 0 | 0 | 1 |
| DO | 0 | 0 | 1 |
| EO | 1 | 1 | 1 |
| FO | 1 | 1 | 0 |
| GO | 1 | 0 | 1 |
| HO | 1 | 0 | 0 |

Fig.6C

| OUTPUT PINS | LOGICAL VALUES ASSIGNABLE TO OUTPUT PINS | | | |
|---|---|---|---|---|
| | 1ST PATTERN | 2ND PATTERN | 3RD PATTERN | 4TH PATTERN |
| AO | 0 | 1 | 1 | 1 |
| BO | 0 | 0 | 1 | 1 |
| CO | 0 | 0 | 0 | 0 |
| DO | 1 | 1 | 1 | 1 |
| EO | 1 | 1 | 0 | 0 |
| FO | 1 | 0 | 1 | 1 |
| GO | 1 | 0 | 0 | 1 |
| HO | 1 | 0 | 0 | 0 |

Fig.7A

| OUTPUT PINS | LOGICAL VALUES ASSIGNABLE TO OUTPUT PINS IN ORDINARY TEST PATTERNS | | | LOGICAL VALUES ASSIGNABLE TO OUTPUT PINS IN ADDITIONAL TEST PATTERNS TO LOCATE SHORT-CIRCUIT FAILURES | | |
|---|---|---|---|---|---|---|
| | 1ST PATTERN | 2ND PATTERN | 3RD PATTERN | 4TH PATTERN | 5TH PATTERN | 6TH PATTERN |
| AO | 0 | 1 | 1 | 0 | — | × |
| BO | 0 | 1 | 0 | 1 | — | — |
| CO | 0 | 0 | 1 | — | — | × |
| DO | 1 | 0 | 0 | × | — | — |
| EO | 1 | 1 | 1 | × | 0 | × |
| FO | 1 | 1 | 0 | × | — | 0 |

Fig.7B

| OBJECTIVE OUTPUT PINS | OTHER OUTPUT PINS | | | | | |
|---|---|---|---|---|---|---|
| | AO | BO | CO | DO | EO | FO |
| AO | \ | × | 0 | 0 | 0 | 0 |
| BO | 0 | \ | 0 | 0 | 0 | 0 |
| CO | 0 | 0 | \ | 0 | 0 | 0 |
| DO | 0 | 0 | 0 | \ | 0 | 0 |
| EO | × | × | × | × | \ | × |
| FO | 0 | × | 0 | × | 0 | \ |

METHOD FOR TESTING PRINTED WIRING BOARDS FOR SHORT CIRCUITS

BACKGROUND OF THE INVENTION

1. Field of the Invention

The present invention relates to a method of testing the functions of a printed wiring board, and particularly, to a method of testing a printed wiring board, to find short-circuit failures between the pins of each LSI (Large-scale Integrated Circuit) mounted on the board, or between wires connecting the LSIs.

2. Description of the Related Art

The number of wires arranged on a printed wiring board is increasing because circuit integration is advancing day by day. To test the functions of wires of the board, effective test patterns are required. Scan circuits are employed to test the board. The board supports LSIs connected to one another through the wires, i.e., nets, and these wires are tested for short-circuit failures. To carry out the test, test patterns are prepared to examine every combination of the wires on all the pins of the LSIs. These test patterns must efficiently carry out the test.

The test patterns apply the logical values 0 and 1 to the wires, and the scan circuits check the logical values in the wires, to detect short-circuit failures. One of the LSIs on the board is selected as a driver and another as a receiver. The output pins of the driver are connected to the input pins of the receiver through the wires. An expected value 0 or 1 is set for an objective output pin of the driver and an opposite expected value for the other output pins of the driver. Observed values at the input pins of the receiver are compared with the expected values, to find short-circuit failures. The test patterns, i.e., combinations of setting and expected values, are prepared for all output pins and are applied thereto through, for example, a tester.

An LSI has, for example, output pins AO, BO, CO, DO, EO, and FO, and these pins and the wires connected thereto are tested for short-circuit failures. For the sake of simplicity of explanation, the scan circuits are supposed to be capable of setting either one of the logical values 0 and 1 on each output pin. A test pattern is prepared to set the logical value 1 only on the output pin AO and the logical value 0 on the other output pins BO to FO. The test pattern is applied to the output pins, and actual values appearing at the output pins BO to FO are observed. If any of the observed values is 1 instead of the expected value 0, the corresponding output pin is short-circuited to the output pin AO. Another test pattern is prepared which sets the logical value 1 on the output pin BO and the logical value 0 on the other output pins AO and CO to FO. Similarly, other test patterns are prepared.

According to the prior art, the number of test patterns prepared is equal to the number of combinations of wires and, therefore, is very large. Namely, the prior art ineffectively prepares test patterns which take a long time to find short-circuit failures.

SUMMARY OF THE INVENTION

An object of the present invention is to solve the problems of the prior art and speedily find short-circuit failures in a printed board with a minimum number of test patterns. Another object of the present invention is to effectively find and locate short-circuit failures in a printed board with a minimum number of test patterns.

In order to accomplish the objects, the present invention provides a method of testing a printed wiring board, to detect short-circuit failures in wires on the board, according to test patterns prepared in advance. The method involves a step of dividing output pins of each circuit element mounted on the board into a group to which a logical value 0 is assignable and a group to which a logical value 1 is assignable, preparing a test pattern for detecting short-circuit failures between the groups, and repeatedly dividing the output pins in each of the groups into a group to which the logical value 0 is assignable and a group to which the logical value 1 is assignable, to thereby provide test patterns for detecting short-circuit failures; and a step of applying the test patterns to the board and determining whether or not values observed at predetermined positions agree with expected output values, to thereby find short-circuit failures among the wires.

It is preferable that the output pins are grouped such that the number of output pins in a group to which the logical value 0 is assignable is equal to the number of output pins in a corresponding group to which the logical value 1 is assignable.

It is preferable to evaluate the first-prepared test patterns, and if these test patterns are insufficient to locate short-circuit failures, prepare additional test patterns to locate short-circuit failures.

It is preferable to apply the first-prepared test patterns to detect short-circuit failures, and only when a short-circuit failure is detected, apply the additional test patterns to locate the short-circuit failure.

Other features and advantages of the invention will be apparent from the following description with reference to the accompanying drawings.

BRIEF DESCRIPTION OF THE DRAWINGS

FIGS. 6A, 6B, and 6C show examples of test patterns;

FIGS. 7A and 7B show examples of additional test patterns to locate short-circuit failures.

DESCRIPTION OF THE PREFERRED EMBODIMENTS

Figure 1:
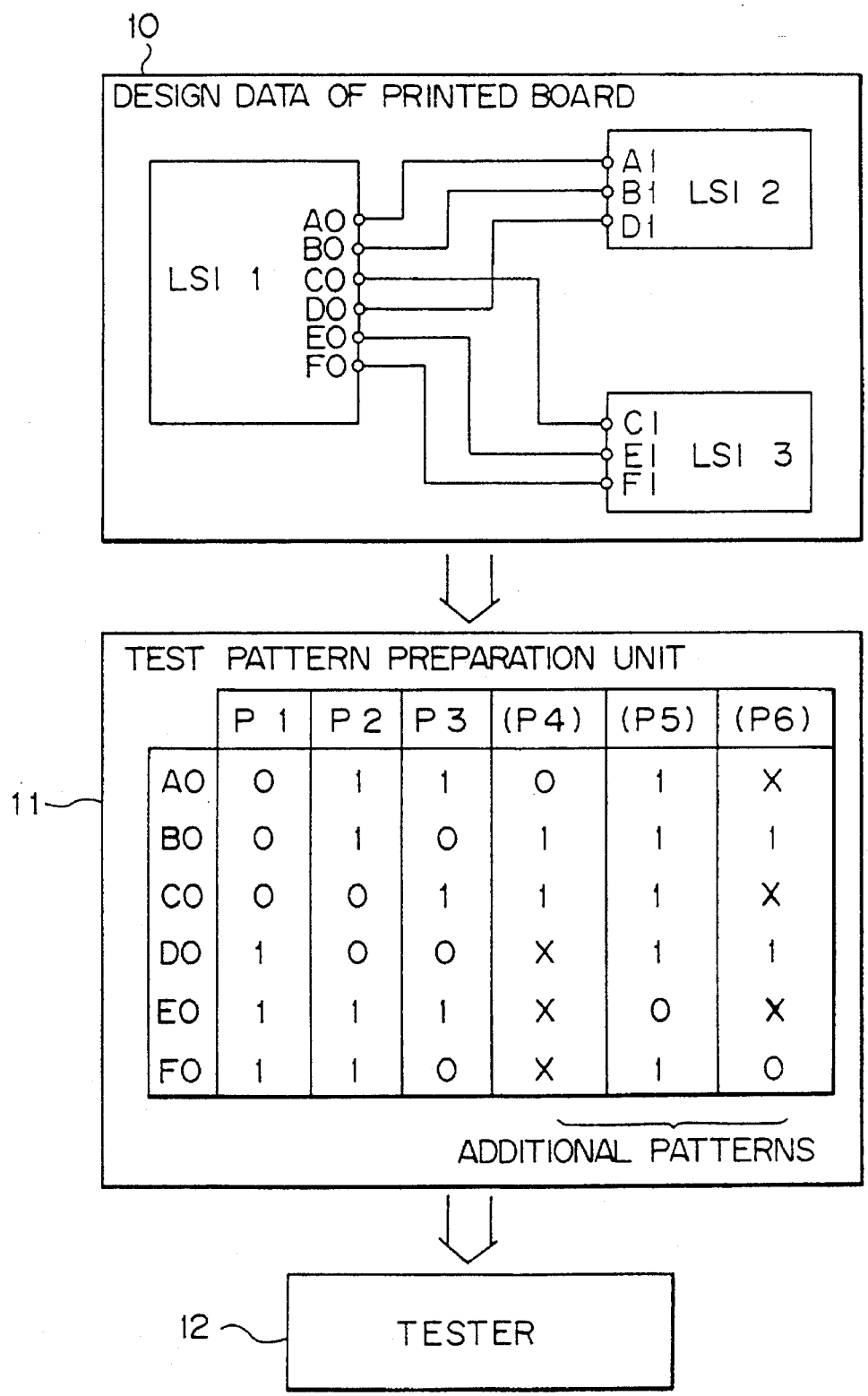
FIG. 1 schematically shows the present invention.

Before explaining the embodiments of the present invention, the principle of the present invention will be explained with reference to FIG. 1.

A test pattern preparation unit 11 prepares test patterns according to design data 10 of a printed board. The test patterns are applied to the board, to detect short-circuit failures in the board. In the figure, expected values are not shown. A tester 12 applies the test patterns to the board, to determine whether or not observed values agree with the expected output values, to thereby determine if the wiring of the board contains short-circuits.

The present invention divides output pins of a driver on the board into a group to which an expected value 0 is assignable and a group to which an expected value 1 is assignable. A short-circuit failure is detectable between any pins set at different respective values. Pins in the same group among which short-circuit failures are undetectable are further divided into a group to which the expected value 0 is assignable and a group to which the expected value 1 is assignable. Such division is repeated to prepare test patterns for detecting a short-circuit failure on any pin. It is preferable to equalize the number of output pins in a group to which the expected value 0 is assignable with the number of output pins in a corresponding group to which the expected value 1 is assignable. This method detects short-circuit failures in a printed board with a minimum number of test patterns.

For example, output pins AO to FO of a driver LSI 1 are connected to input pins AI, BI, and DI of a receiver LSI 2 and input pins CI, EI, and FI of a receiver LSI 3 through wires that are tested for short-circuit failures. The output pins of the driver LSI 1 are divided into a group AO to CO and a group DO to FO. A test pattern P1 is prepared to assign the logical value 0 to the group AO to CO and the logical value 1 to the group DO to FO. A test pattern P2 is prepared by dividing each of the groups of the output pins AO to CO and DO to FO into a group to which the logical value 0 is assignable and a group to which the logical value 1 is assignable. In this way, the output pins are hierarchically grouped to form a test pattern P3. In the example of FIG. 1, the three test patterns P1, P2, and P3 are able to detect short-circuit failures in the wires connecting the output pins.

These test patterns are evaluated, and if necessary, additional test patterns will be prepared to locate short-circuit failures. As a result, short-circuit failures will be effectively detected and located with a minimum number of test patterns.

When an observation value at the output pin AO is 1, under the test pattern P1, it is understood that the pin AO is short-circuited to another pin. The test patterns P1, P2, and P3, however, are insufficient to determine which pin is short-circuited to the pin AO. Accordingly, additional test patterns P4, P5, and P6 are prepared to locate the short-circuit failure. With these additional test patterns, any short-circuit failure will be located. A logical value X in the figure may be any one of 0 and 1.

The short-circuit failure detection test may be carried out with all test patterns including the additional test patterns. It is preferable, however, to separately use the ordinary and additional test patterns. Only when a short-circuit failure is detected with the ordinary test patterns should the additional test patterns be employed to locate the failure. This will reduce the number of test patterns to be used when there are no short-circuit failures.

Figure 2:
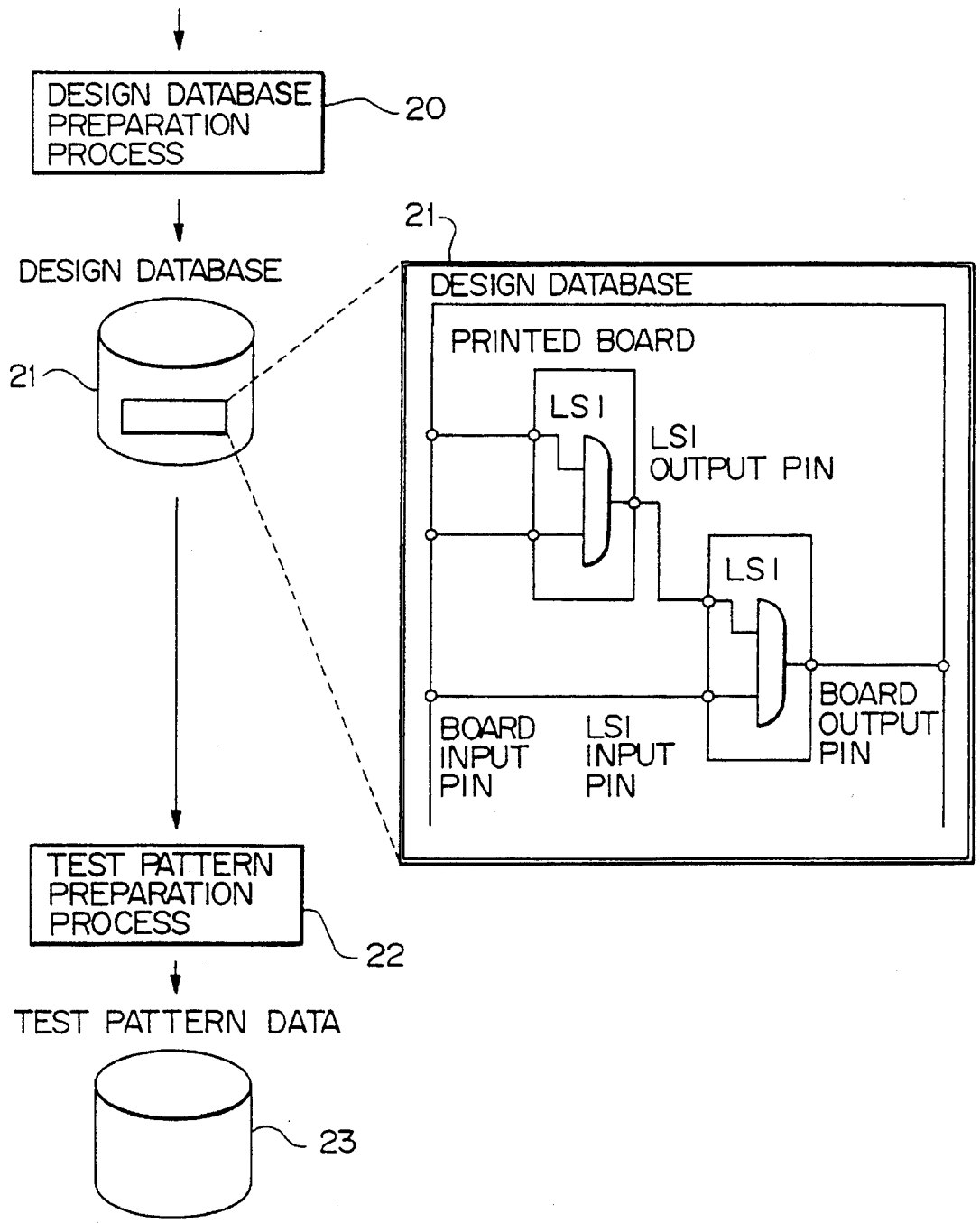
FIG. 2 shows a test pattern preparation process according to an embodiment of the present invention.

Now, an embodiment according to the present invention will be explained. FIG. 2 schematically shows a test pattern preparation process according to the embodiment, and FIG. 3 shows a short-circuit failure detection test according to the embodiment.

In FIG. 2, a design database preparation process 20 collects design data for a printed wiring board and LSIs arranged on the board, to form a design database 21. The design database 21 contains data related to the board, connections among the LSIs and other parts on the board, and input/output pins. The database 21 also contains data related to the design of the LSIs, to LSI internal logic, and to LSI input/output pins.

According to the design database 21, a test pattern preparation process 22 prepares input/output test patterns for carrying out the short-circuit detection test. Each input pattern includes values (logical values) set for board input pins and internal scan flip-flops (hereinafter referred to as the scan FFs). Each output pattern includes expected values (logical values) at board output pins and LSI input/output pins. These input/output patterns form test pattern data 23.

Figure 3:
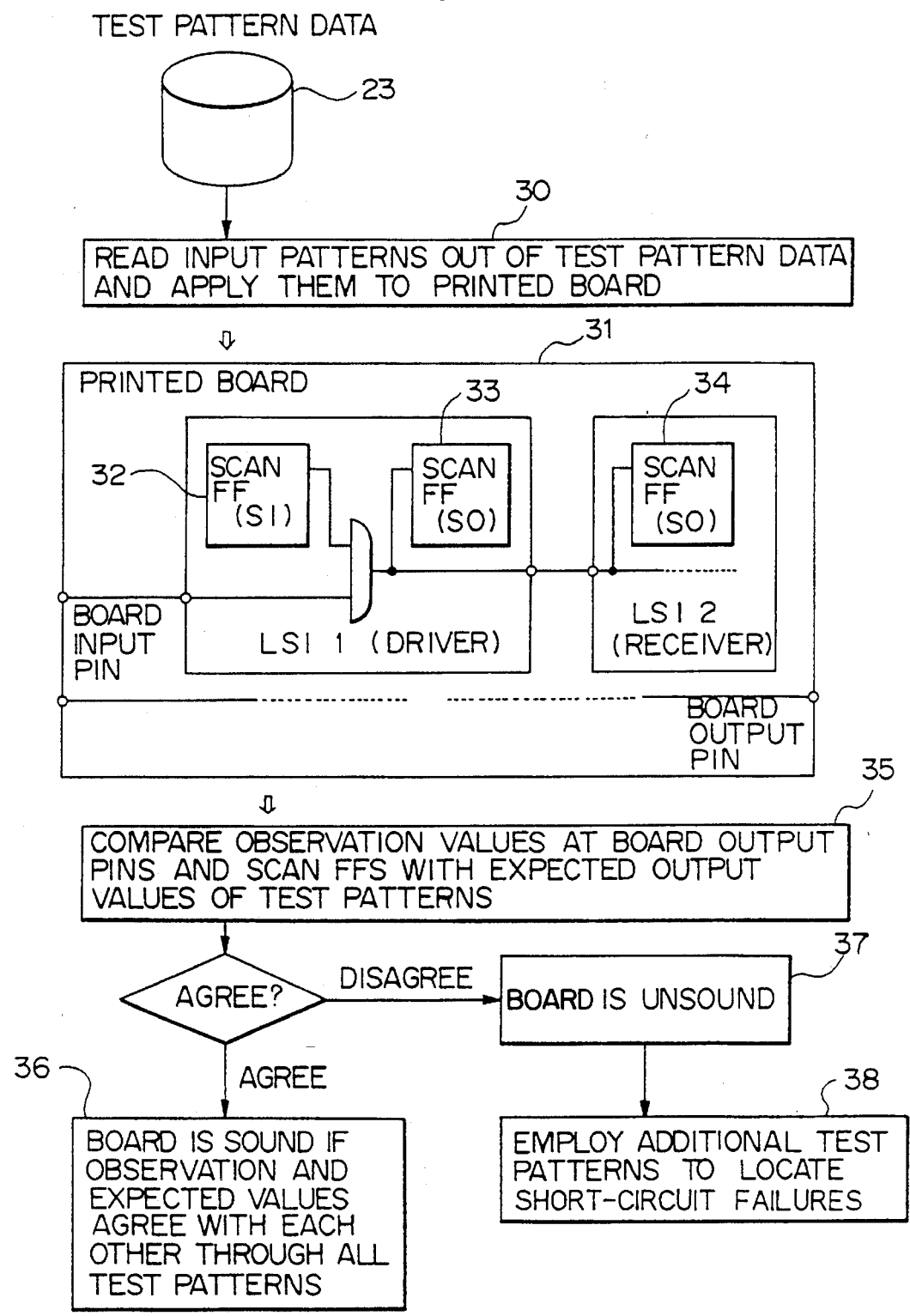
FIG. 3 shows a short-circuit failure detection test according to an embodiment of the present invention.

FIG. 3 shows the short-circuit failure detection test. A process 30 receives the test pattern data 23 and applies them to input pins of a board 31 and a scan-in (SI) FF 32.

A process 35 observes the output pins on the board 31 and scan-out (SO) FFs 33 and 34 and compares the observed (i.e., "observation") output-values with the expected output values. If all observed values agree with the expected output values, a process 36 determines that the wiring of the board is sound. If they do not agree with each other, a process 37 determines that the wiring of the board has short-circuit failures. If required, a step 38 uses additional test patterns to locate the short-circuit failures.

Figure 4:
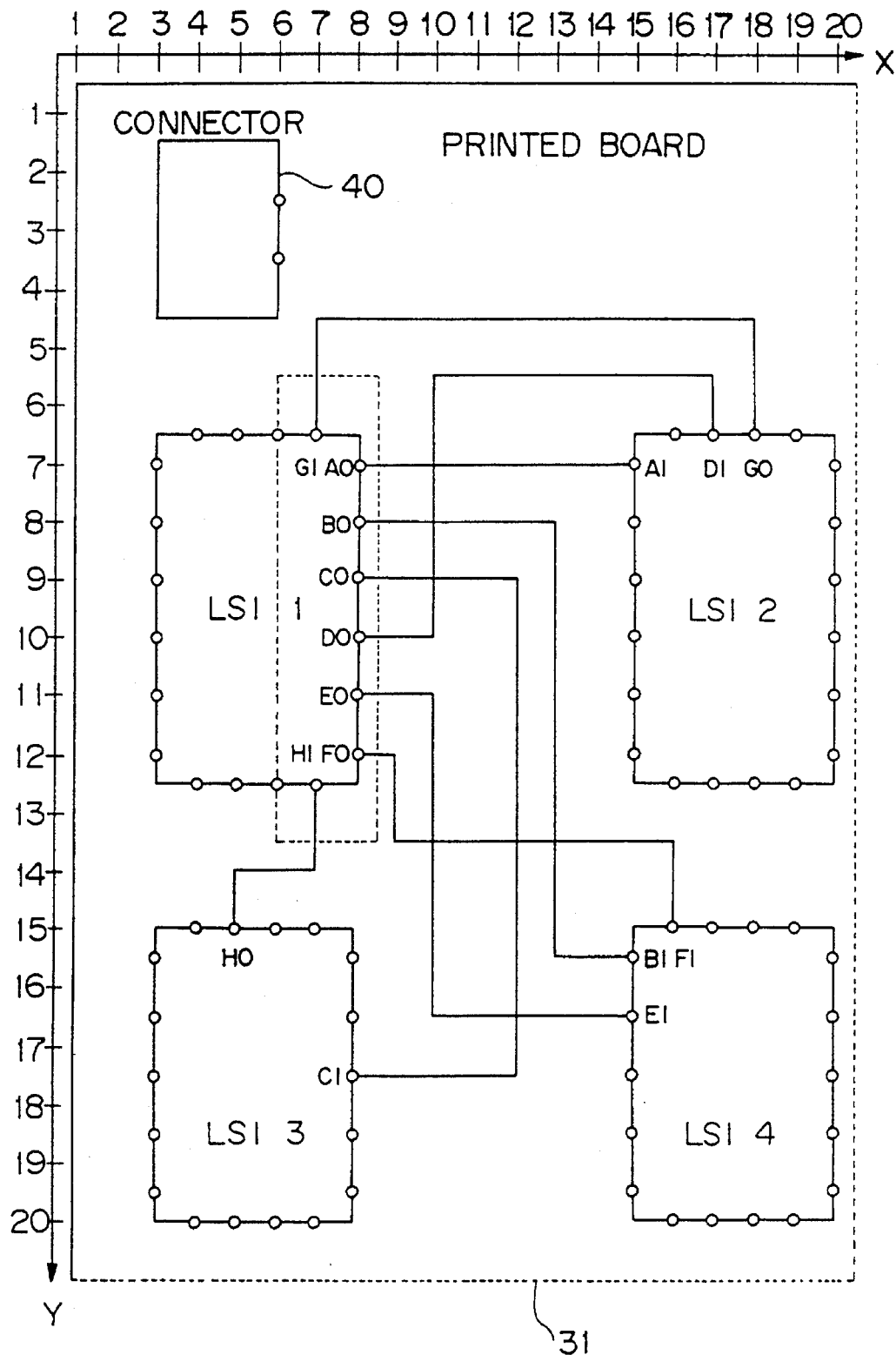
FIG. 4 shows connections among parts on a printed board to be tested according to the present invention.
Figure 5:
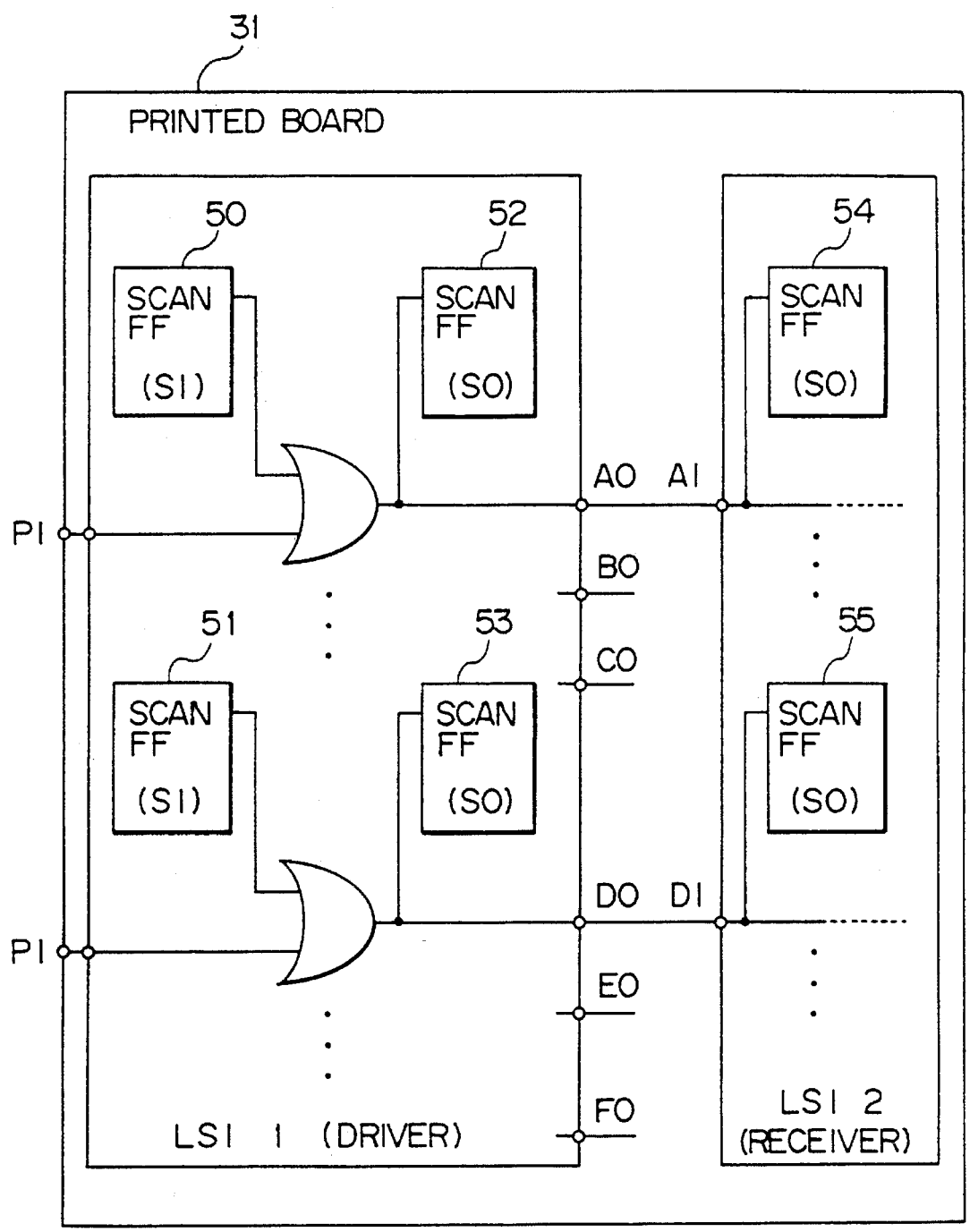
FIG. 5 shows a method of setting logical values on output pins of the parts of FIG. 4.

FIG. 4 shows connections between parts arranged on a printed board to be tested according to the present invention. FIG. 5 explains a method of setting logical values for the output pins of the parts of FIG. 4. FIGS. 6A, 6B, and 6C show examples of test patterns. FIGS. 7A and 7B show examples of additional test patterns to locate short-circuit failures.

Referring to FIG. 4, the board 31 has an input connector 40 and LSIs 1 to 4. The LSIs have output pins AO through HO and input pins AI through HI. Wires connecting the output and input pins of the LSIs are tested for short-circuit failures. In FIG. 5, the board 31 has input pins PI, scan-in (SI) FFs 50 and 51, and scan-out (SO) FFs 52 to 55.

Test patterns are prepared to set logical values 0 and 1 for the SI FFs 50 and 51 and the input pins PI of the board 31 as well as expected values for the output pins of the driver LSI 1 and the input pins of the receiver LSI 2. A method of preparing such test patterns will be explained in detail with reference to FIG. 4.

According to data of the wires connecting the parts mounted on the board of FIG. 4, the output pins are divided into a group to which 0 is assignable and a group to which 1 is assignable, to prepare a first short-circuit failure detection pattern of FIG. 6A. Each of the groups of the output pins is again divided into a group to which 0 is assignable and a group to which 1 is assignable. At this time, the output pins are grouped such that each group has the same number of output pins. A second pattern of FIG. 6A is then prepared. In this way, the groups are repeatedly divided into smaller groups, to thereby prepare test patterns for detecting short-circuit failures in the board 31.

The test patterns for detecting short-circuit failures among the output pins AO, BO, CO, DO, EO, and FO of the LSI 1 of FIG. 4 will be explained. The first pattern of FIG. 6A is prepared if 0 is assignable to the output pins AO, BO, and CO and 1 to the output pins DO, EO, and FO. With this pattern and the scan circuits, a test may be carried out to find short-circuit failures between, for example, the output pin AO and the output pins DO, EO, and FO set at the opposite value 1.

The first pattern is incapable of detecting short-circuit failures among the output pins AO, BO, and CO that are in the same group. If 1 is assignable to the output pin BO, the second pattern of FIG. 6A is prepared to detect a short-circuit failure between the output pins AO and BO. If the output pin CO is not dividable, i.e., if only 0 is assignable to the pin CO, this pin is determined to be a short-circuit failure undetectable pin. Every output pin and group is checked in the same manner with these patterns.

A technique of equally dividing output pins into a group to which 0 is assignable and a group to which 1 is assignable will be explained with reference to FIGS. 6B and 6C. The figures involve eight output pins.

In FIG. 6B, a first test pattern is prepared by dividing the output pins into a group to which 0 is assignable and a group to which 1 is assignable. Each of the groups is further divided into a group to which 0 is assignable and a group to which 1 is assignable. At each division, the numbers of the output pins in the groups are made equal to each other. If they are not equal to each other, the number of test patterns prepared becomes greater as shown in FIG. 6C.

The first pattern of FIG. 6B involves a group of four output pins AO, BO, CO, and DO to which 0 is assignable and a group of four output pins EO, FO, GO, and HO to which 1 is assignable. The second pattern is prepared after calculating the number of the output pins in each of the groups of the first pattern. The group of AO to DO with 0 is divided into a group of CO and DO to which 0 is assignable and a group of AO and BO to which 1 is assignable. Similarly, the group of EO to HO with 1 is divided into a group of GO and HO to which 0 is assignable and a group of EO and FO to which 1 is assignable.

When the output pins are equally divided into groups as shown in FIG. 6B, three patterns are sufficient to complete the division. On the other hand, when the output pins are unequally divided into groups as shown in FIG. 6C, four patterns must be prepared to complete the division.

Preparation of additional test patterns to locate short-circuit failures will be explained. In the following explanation, it is supposed that a wiring net involving an output pin of logical value 0 and an output pin of logical value 1 provides 1 if these output pins are short-circuited. It is possible to configure so that the wiring net provides 0 upon a short-circuit failure.

FIG. 7A shows first to third ordinary patterns for detecting short-circuit failures in a printed board. An optional objective pin is selected in the first to third patterns, and pins that become 1 (it will be 0 if a short-circuit failure is represented with 0) when the objective pin has 0 (this will be 1 if a short-circuit failure is represented with 0) are picked up through the first to third patterns.

For example, the output pin AO is selected as an objective output pin through the first to third patterns. The pin AO is expected to have 0 in the first pattern. At this time, the output pins DO, EO, and FO are each expected to have 1. Accordingly, the first pattern is capable of locating a short-circuit failure between the pin AO and the pins DO, EO, and FO. In the second and third patterns, the pin AO is expected to have 1. Accordingly, even if a short-circuit failure occurs between the output pin AO and the other pins, the failure is not locatable because the failure with 1 provided by the net is equal to the expected value 1 of the net. In this way, every output pin is evaluated. Only for combinations of the output pins on which short-circuit failures are not locatable, are additional test patterns prepared to provide an objective output pin with 0 and the other output pins with 1. This results in improving an ability of locating short-circuit failures. In FIG. 7A, a logical value X indicates that the expected value of the corresponding output pin is arbitrary.

In this way, the location of short-circuit failures is evaluated on every output pin, and additional fourth to sixth patterns of FIG. 7A are prepared to locate any short-circuit failure.

FIG. 7B shows a result of evaluating the short-circuit detection test patterns. A result of the evaluation is used to prepare the additional patterns for improving the ability of locating short-circuit failures. In the figure, a circle mark indicates that there is a test pattern in which an objective output pin takes 0 and an opposite output pin takes 1. A cross mark X indicates that there is no such test pattern.

Figure 8:
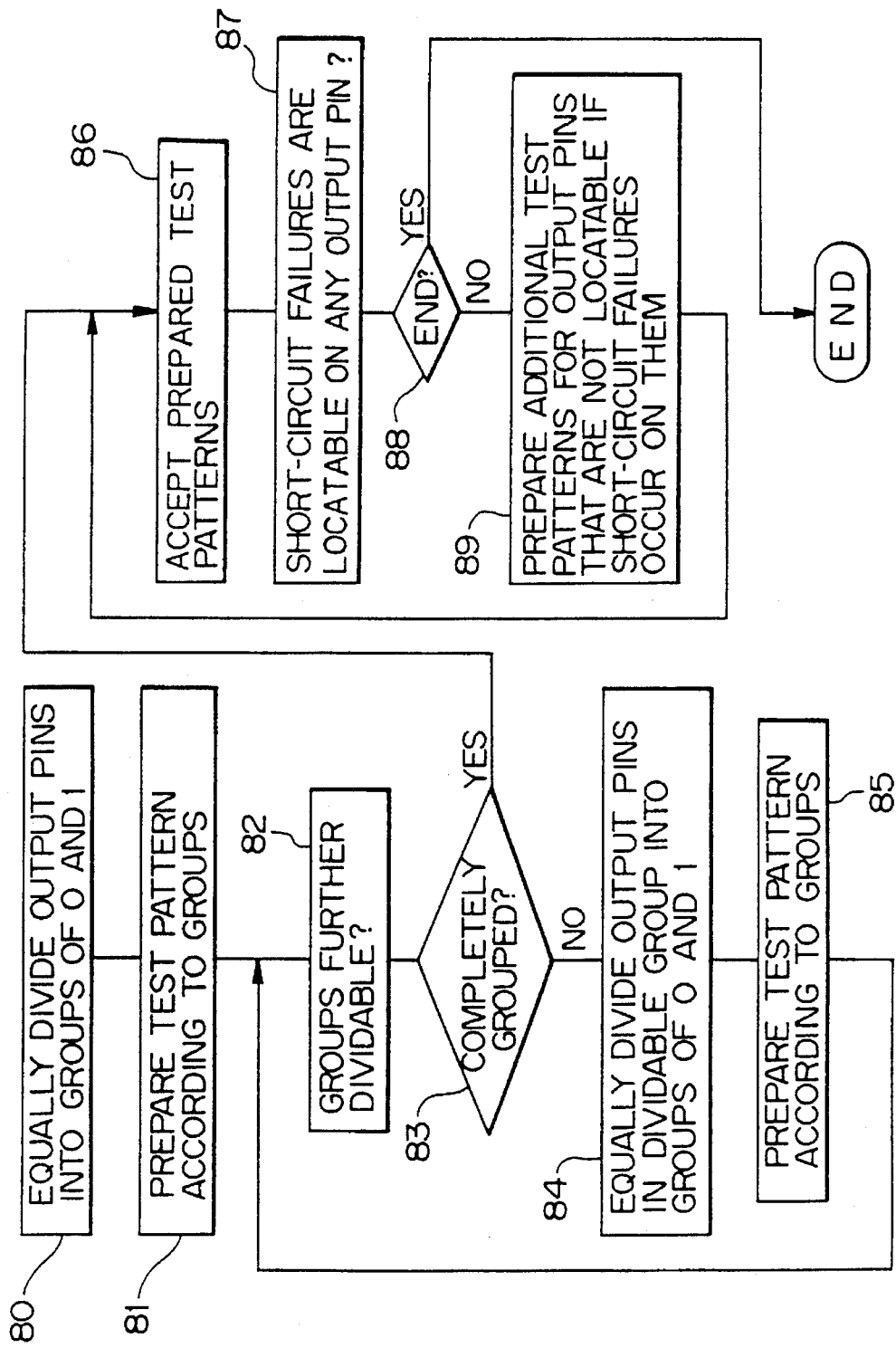
FIG. 8 shows steps of preparing test patterns according to an embodiment of the present invention.

FIG. 8 is a flowchart showing steps of preparing test patterns according to the embodiment of the present invention.

Step 80 divides output pins into a group to which a logical value 0 is assignable and a group to which a logical value 1 is assignable. Step 81 combines the groups to prepare a test pattern. Step 82 examines whether or not each of the groups can be further divided into a group to which the logical value 0 is assignable and a group to which the logical value 1 is assignable. Step 83 examines whether or not the output pins have been completely divided. If they have been completely divided, step 86 is executed. If they are further dividable, step 84 divides each of the dividable groups into a group to which the logical value 0 is assignable and a group to which the logical value 1 is assignable. Step 85 combines the groups to prepare another test pattern. The flow then returns to step 82 to repeat these steps.

After the output pins are completely divided, step 86 accepts the prepared test patterns. Step 87 checks every output pin as to whether or not short-circuit failures are locatable, to determine whether or not additional patterns must be prepared. Step 88 determines whether or not the test patterns are complete. If they are complete, the flow ends. If there is still a combination of output pins in which short-circuit failures are not locatable, step 89 prepares another additional test pattern for locating a short-circuit failure in the combination. Then, the flow returns to step 86, to repeat these steps.

The test patterns thus prepared are used to detect short-circuit failures in the board. The number of these patterns is the minimum necessary to effectively test the board.

As explained above, the present invention equally divides output pins of LSIs into a group to which a logical value 0 is assignable and a group to which a logical value 1 is assignable, to thereby prepare a test pattern. Only for output pins in the same group on which short-circuit failures are undetectable is another test pattern for detecting short-circuit failures prepared. This results in reducing the number of the test patterns. The test patterns are evaluated, and according to the evaluation, additional test patterns are prepared to improve an ability of locating short-circuit failures. In this way, the present invention effectively prepares test patterns to carry out a short-circuit failure detection test.

Although the present invention has been disclosed and described by way of one embodiment, it will be apparent to those skilled in the art that other embodiments and modifications of the present invention are possible without departing from the spirit or essential features thereof.

We claim:

1. A method of testing a printed wiring board, to detect short-circuit failures among wires arranged on the board according to test patterns prepared in advance comprising the steps of:

dividing the output pins of each circuit element mounted on the board into a group to which a logical value 0 is assignable and a group to which a logical value 1 is assignable, preparing a first test pattern for detecting short-circuit failures between the groups, and repeatedly dividing the output pins in each of the groups into a group to which the logical value 0 is assignable and a group to which the logical value 1 is assignable and wherein the ratio of the respective numbers of the output pins in the two divided groups is close to 1, to thereby provide first test patterns for detecting short-circuit failures; and applying the first test patterns to the board using a tester and determining whether or not values observed at predetermined positions agree with expected output values, to thereby detect short-circuit failures among the wires.

2. The method according to claim 1, wherein the step of preparing the first test patterns groups the output pins such that the number of output pins in a group to which the logical value 0 is assignable is equal to the number of output pins in a corresponding group to which the logical value 1 is assignable.

3. The method according to claim 1, wherein the step of preparing the first test patterns evaluates the prepared first test patterns, and if these first test patterns are insufficient to locate short-circuit failures, additionally prepares second test patterns to locate short-circuit failures.

4. The method according to claim 2, wherein the step of preparing the test patterns evaluates the prepared test patterns, and if these test patterns are insufficient to locate short-circuit failures, additionally prepares second test patterns to locate short-circuit failures.

5. The method according to claim 3, wherein the step of detecting short-circuit failures among the wires employs the first-prepared test patterns to detect short-circuit failures, and only when a short-circuit failure is detected, employs the additionally prepared second test patterns to locate the short circuit failure.

6. The method according to claim 4, wherein the step of detecting short-circuit failures among the wires employs the first-prepared test patterns to detect short-circuit failures, and only when a short-circuit failure is detected, employs the additionally prepared second test patterns to locate the short circuit failure.

* * * * *

UNITED STATES PATENT AND TRADEMARK OFFICE
CERTIFICATE OF CORRECTION

PATENT NO. : 5,485,094
DATED : Jan. 16, 1996
INVENTOR(S) : ENDOH et al.

It is certified that error appears in the above-indentified patent and that said Letters Patent is hereby corrected as shown below:

Col. 3, line 26, change "a group" to --a first sub-group--;
line 27, change "a group" to --a second sub-group--.

Signed and Sealed this

Sixteenth Day of July, 1996

Attest:

BRUCE LEHMAN

Attesting Officer   Commissioner of Patents and Trademarks